(12) United States Patent
Wilke et al.

(10) Patent No.: US 8,941,984 B2
(45) Date of Patent: Jan. 27, 2015

(54) STORAGE BRIDGE BAY CANISTER ATTACHMENT SYSTEM AND METHOD OF FORMING SAME

(75) Inventors: Jeffrey D. Wilke, Palmer Lake, CO (US); Yulong Xi, ChuCun (CN); Barry E. Caldwell, Colorado Springs, CO (US)

(73) Assignee: Jabil Circuit, Inc., St. Petersburg, FL (US)

( * ) Notice: Subject to any disclaimer, the term of this patent is extended or adjusted under 35 U.S.C. 154(b) by 305 days.

(21) Appl. No.: 13/591,883

(22) Filed: Aug. 22, 2012

(65) Prior Publication Data
US 2013/0222992 A1    Aug. 29, 2013

Related U.S. Application Data

(60) Provisional application No. 61/525,860, filed on Aug. 22, 2011.

(51) Int. Cl.
G06F 1/18 (2006.01)
H05K 3/22 (2006.01)
H05K 3/30 (2006.01)

(52) U.S. Cl.
CPC *G06F 1/186* (2013.01); *H05K 3/22* (2013.01); *H05K 3/30* (2013.01)

USPC ............... 361/679.4; 361/679.43; 361/752; 361/756; 361/796; 361/801; 312/223.1; 312/223.2; 248/221.12

(58) Field of Classification Search
USPC ......... 361/679.4, 679.43, 737, 752, 756, 759, 361/796, 801; 312/223.1, 223.2; 248/221.12
See application file for complete search history.

(56) References Cited

U.S. PATENT DOCUMENTS 7,267,550 B1 * 9/2007 Eckberg et al. ............. 439/65
7,539,021 B2 * 5/2009 Peng ........................... 361/759

* cited by examiner

*Primary Examiner* — Robert J Hoffberg
*Assistant Examiner* — Mukund G Patel
(74) *Attorney, Agent, or Firm* — Price Heneveld LLP

(57) ABSTRACT

A tool-less printed circuit board (PCB) bracket system for attaching an input/output (I/O) interface PCB to a bulkhead includes a main PCB and card assembly having a bracket mounted to the main PCB. One or more keyhole fasteners are attached to the main PCB for holding the bracket into a fixed position. The card bracket includes a release mechanism for releasably detaching the card bracket assembly from the keyhole fasteners without the use of tools for easily separation and servicing.

13 Claims, 4 Drawing Sheets

STORAGE BRIDGE BAY CANISTER ATTACHMENT SYSTEM AND METHOD OF FORMING SAME

CLAIM OF PRIORITY

This application claims the benefit of U.S. Provisional Application No. 61/525,860 filed on Aug. 22, 2011, entitled TOOL-LESS PCB BRACKET TO CANISTER/BULKHEAD ATTACH METHOD, the entire contents of which are incorporated herein by reference.

FIELD OF THE INVENTION

The present invention relates generally to an attachment system for mounting a peripheral component interconnect (PCI) card in a storage bridge bay (SBB) canister of a computer tower housing.

BACKGROUND OF THE INVENTION

PCI cards are well known in the art and are used in personal computers for providing an interface for adding hardware, which offers additional computer functionality. A PCI card may be comprised of one or more PCBs, which may be attached to the PCI card. Various methods are then used for mounting the PCI card in the personal computer. One such method uses an L-shaped bracket for mounting devices to the PCB. Although the L-bracket offers a good mechanical connection within the SBB canister, it requires the use of tools for tightening or loosening the attachment screws or other fasteners typically used to attach the PCI card within the SBB canister. Accordingly, other types of solutions are required for mounting the PCI card in the SBB.

BRIEF DESCRIPTION OF THE FIGURES

The accompanying figures, where like reference numerals refer to identical or functionally similar elements throughout the separate views, and which together with the detailed description below are incorporated in and form part of the specification, serve to further illustrate various embodiments and to explain various principles and advantages, all in accordance with the present invention.

Figure 1:
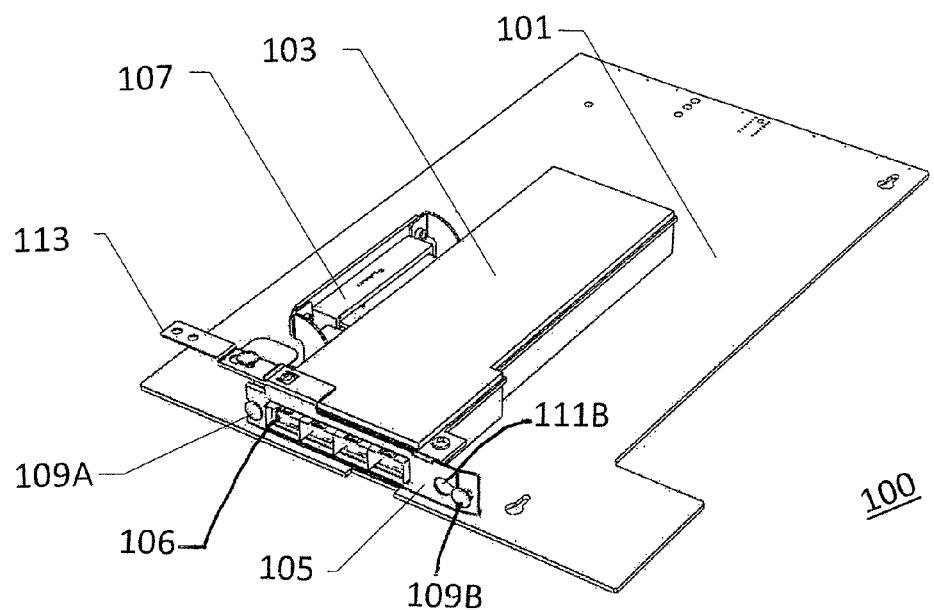
FIG. 1 is a perspective view showing the tool-less printed circuit board attachment system in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to a tool-less PCB bracket-to-canister attachment system. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

FIG. 1 is a perspective view showing the tool-less printed circuit board attachment system in accordance with an embodiment of the invention. The tool-less printed circuit board attachment system 100 includes a substantially flat substrate such as PCB 101 where a card assembly 103 is mounted thereto. The PCB 101 is a substrate that can be made of FR-4 material or the like. The card assembly 103 is mounted on an upper portion of the PCB 101 so that a card assembly bracket and release lever extend to a front edge of the PCB 101. A connector 107 extends from the card assembly 103 and operates to mate with a corresponding connector for providing an electrical and/or data connection to the card assembly 103.

A front portion of the card assembly 103 includes a bracket 105 having one or more electrical connectors 106 for connecting external components to the card assembly 103. By way of example and not limitation, these other components may be devices such as cameras, memory devices or the like which interface with the computer through the PCI card. In order to hold the card assembly 103 to the PCB 101, one or more keyhole fasteners 109A, 109B are fixedly mounted to the surface of the PCB 101. The keyhole fasteners 109A, 109B are positioned on the PCB 101 so as to be aligned with a corresponding keyhole 111A and 111B in the bracket 105. In this exemplary embodiment, the keyhole 111A is illustrated as a slot or notch in the edge of the card assembly bracket 105 although other types of fasteners could also be used. Further, those skilled in the art will recognize that the keyhole 111B is locked at the opposite side of the card assembly bracket 105 and has a substantially round opening at one end. The round opening or keyhole abuts a keyway channel. The channel is sized to be a smaller diameter than that of the round opening so as to hold and/or lock the keyhole fasteners 109A, 109B in a fixed position when the round head of the keyhole fasteners 109A, 109B is moved within the channel.

Figure 2A:
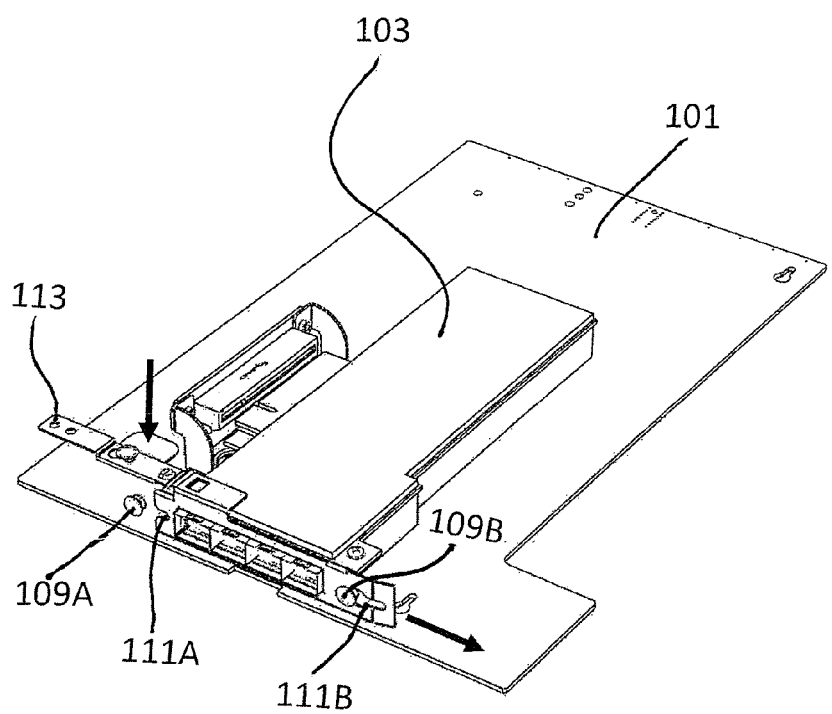
FIG. 2A is a perspective view showing the card assembly of FIG. 1 in a laterally shifted position for removal.
Figure 2B:
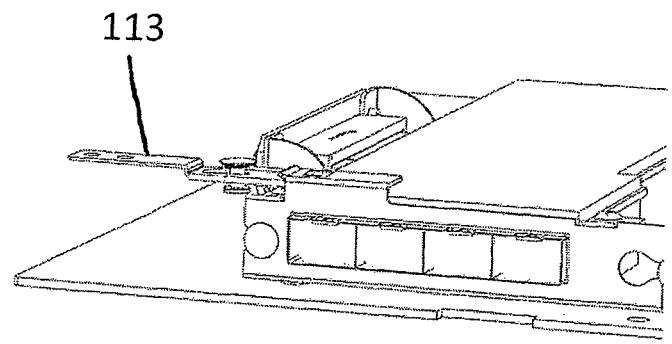
FIG. 2B is a perspective view showing details of the release lever.
Figure 2C:
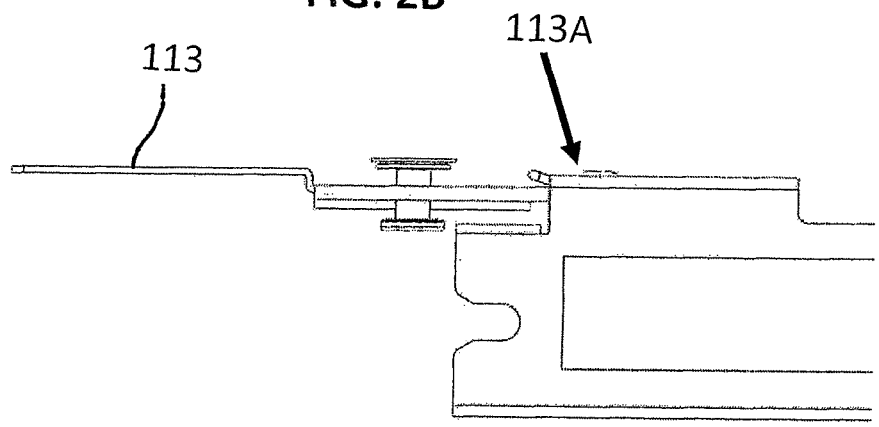
FIGS. 2C and 2D are top views of the latch assembly showing movement of the release mechanism to disengage the card assembly.
Figure 2D:
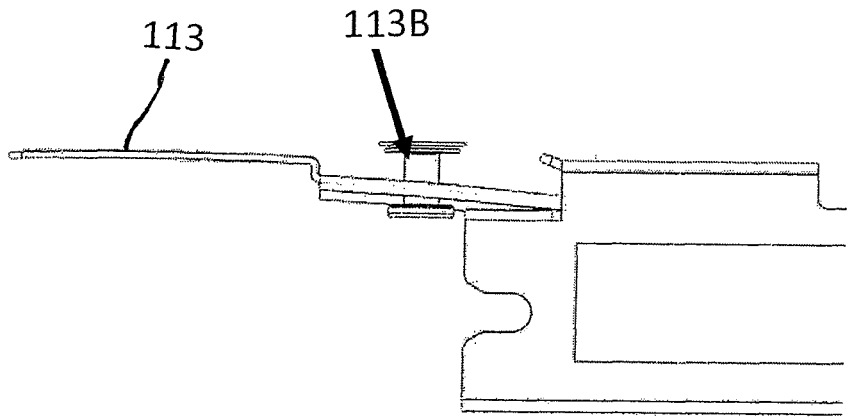

FIG. 2A is a perspective view showing the card assembly of FIG. 1 in a shifted or tilted position for removal. FIG. 2B is a top view of the card assembly shown in FIG. 2A. In FIGS. 2A and 2B, the circuit board attachment system 200 is shown with the release lever 113 moved to allow a portion of the assembly bracket 105 to be moved from under the lever 113. FIGS. 2C and 2D illustrate top views showing when the lever 113 is moved and/or depressed. The lever 113 removes a resilient biasing force applied by a spring, cantilevered member, or the like. Removal of the force allows the card assembly 103 to slide and/or be moved laterally. Thereafter, a force can be applied to push or slide the card assembly 103 in a sideward manner toward a side edge 115 of the PCB 101. This, in turn, permits the keyhole fastener 109A, 109B to be disengaged from its corresponding notch and/or keyhole 111A, 111B which are located at the front ends of the card assembly bracket 105.

Figure 3A:
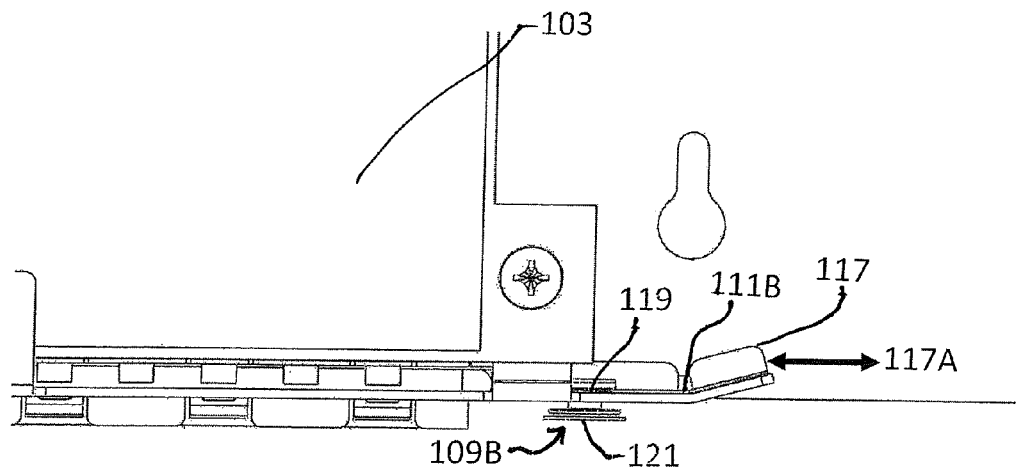
FIG. 3A illustrates a top view showing the bracket before it is in an assembled condition.

FIG. 3A illustrates a top view showing the bracket before it is in an assembled condition. A head 121 of the keyhole fastener 109B is positioned so that it protrudes through the card assembly bracket 105. A shaft 119, forming a portion of the keyhole fastener 109B, allows the keyhole fastener 109B to slide within the channel or slot of the corresponding keyhole.

Figure 3B:
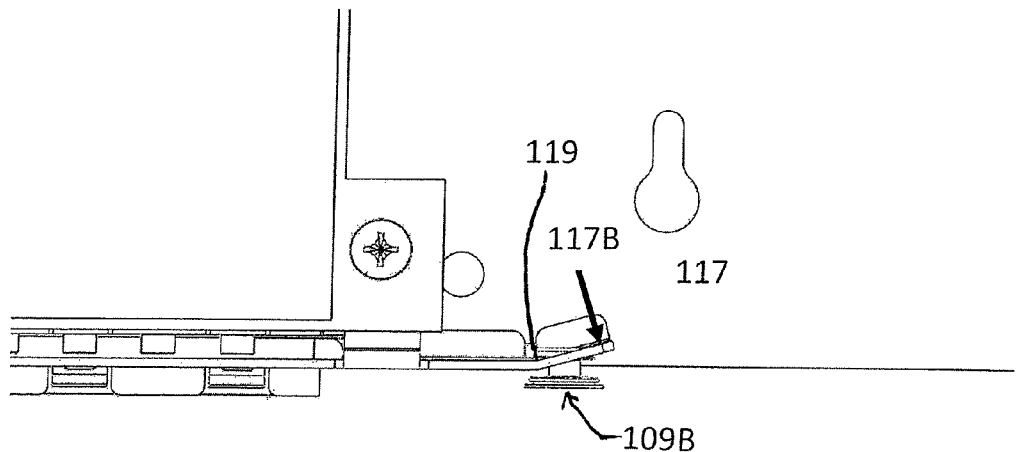
FIG. 3B illustrates a top view shown in FIG. 3A where the bracket is in an installed position and engaged with the keyhole fastener.

FIG. 3B illustrates a top view shown in FIG. 3A where the bracket is in an installed position and engaged with the keyhole fastener. As seen in FIG. 3B, an end 117 of the card assembly bracket 105 includes a bend and/or angled edge for allowing the keyhole fastener 109B to be frictionally engaged with the shaft 119 and head 121. This allows the card assembly bracket 105 to remain in a fixed position with the keyhole fastener 109B since the keyhole fastener 109B is frictionally engaged within the end 117 at a predetermined position, namely, the end of the slot in the keyhole.

Figure 4:
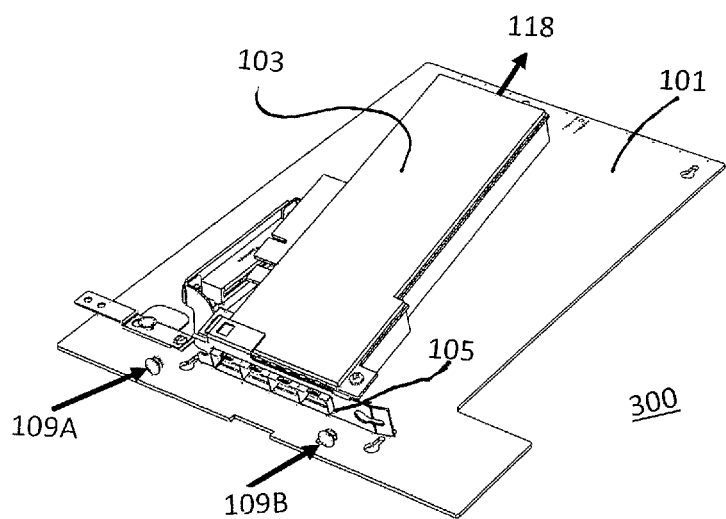
FIG. 4 illustrates a perspective view showing the card assembly of FIG. 1 in a position for removal.

FIG. 4 is a perspective view showing the card assembly of FIG. 1 in a position for removal and/or separation of the card assembly from the PCB. As seen in FIG. 4, the circuit board attachment system 300 is shown with the rear 117 of the card assembly 103 lifted from the surface of the PCB 101. The card bracket assembly 105 is separated from and is positioned rearwardly of the keyhole fasteners 109A, 109B. This allows the card bracket assembly 105 to be removed from the PCB 101 and exchanged with another electronic device. Thus, once the card bracket assembly 105 is slipped over the keyhole fasteners 109A, 109B, this allows the card assembly 103 to be easily removed for service or other use.

Figure 5:
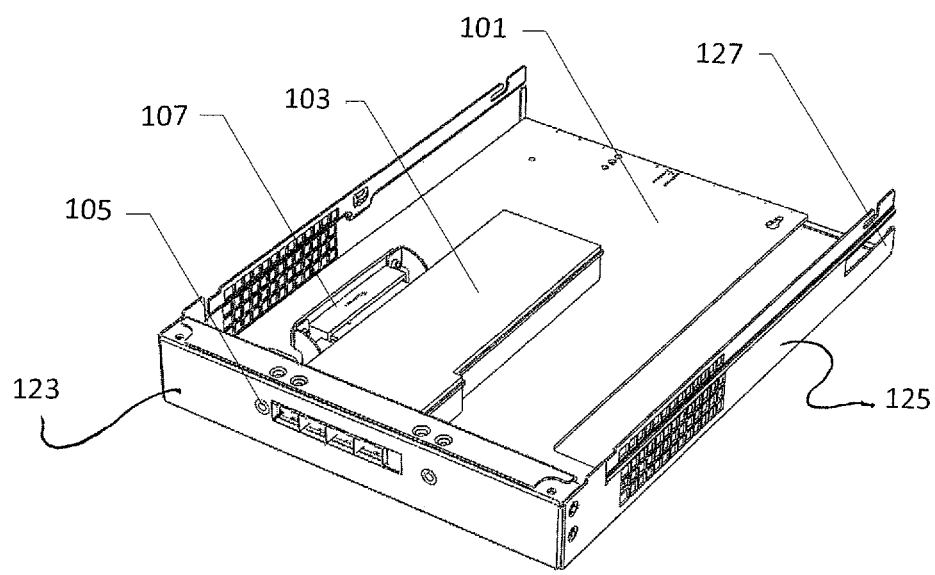
FIG. 5 illustrates a perspective view showing the card assembly in an assembled condition.

FIG. 5 illustrates a perspective view showing the card assembly in an assembled condition. As seen in FIG. 5, a face cover 123 and side panels 125 are positioned over sides of the card assembly bracket 105 for providing a finished appearance. The rear of the side panels includes one or more slots 127 that work to form a canister-type assembly for insertion into the SBB of a computer housing such as a tower housing or the like. Although shown as rectangular slots, those skilled in the art will further recognize that other sizes and/or shapes of slots can be utilized. The invention is advantageous as in the assembly process, the use of keyhole fasteners allows quick assembly and disassembly of the card assembly so that no tools are required by the user or technician.

Thus, the present invention is directed to a tool-less printed circuit board (PCB) bracket system for attaching an input/output (I/O) interface PCB to a bulkhead. The system includes a main PCB and a PCI card assembly having a bracket mounted to the main PCB. One or more fasteners are attached to the main PCB for holding the bracket into a fixed position. The card bracket includes a levered release mechanism for easily and releasably detaching the card bracket assembly from the at least one fastener without the use of tools.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as critical, required, or essential features or elements of any or all the claims. The invention is defined solely by the appended claims including any amendments made during the pendency of this application and all equivalents of those claims as issued.

We claim:

1. A storage bridge bay canister attachment system comprising:
   a main printed circuit board (PCB);
   a card assembly having a bracket mounted to the main PCB, the card assembly includes a release lever;
   at least one keyhole fastener attached to the main PCB for holding the bracket into a fixed position; and
   wherein moving the release lever releasably detaches the card assembly from the at least one keyhole fastener without the use of tools.

2. A storage bridge bay canister attachment system as in claim 1, wherein the card assembly includes an at least one electrical connector for providing an interface with the card assembly.

3. A storage bridge bay canister attachment system as in claim 1, wherein the card assembly includes an installation connector for providing an interface with the main PCB.

4. A storage bridge bay canister attachment system as in claim 1, wherein the keyhole fastener passes through a keyhole in the card assembly bracket.

5. A storage bridge bay canister attachment system as in claim 1, wherein the keyhole fastener attaches within a keyhole of the bracket.

6. A peripheral component interconnects (PCI) card attachment system for use in a storage bridge bay (SBB) of a computer comprising:
   a printed circuit board (PCB);
   a card assembly having at least one release bracket, the at least one bracket having a keyhole;
   a keyhole fastener attached to the PCB, the keyhole fastener engages with the keyhole;
   a release mechanism attached to the at least one release bracket,
   wherein the release mechanism includes a lever for releasing the at least one release bracket from the keyhole fastener allowing the card assembly to be separated from the PCB.

7. A PCI card attachment system as in claim 6, wherein the card assembly includes an at least one electrical connector for providing an electrical interface with the card assembly.

8. A PCI card attachment system as in claim 6, wherein the card assembly includes an installation connector for providing an interface with the PCB.

9. A PCI card attachment system as in claim 6, wherein the release mechanism frictionally engages with the card assembly for holding the card assembly into a fixed position.

10. A method for utilizing a main printed circuit board (PCB) bracket system for attaching a bracket to a main PCB comprising the steps of:
   providing the main PCB;
   mounting a card assembly having the bracket to the main PCB;
   utilizing at least one keyhole fastener attached to the main PCB for holding the bracket into a fixed position; and
   providing a release lever for releasable detaching the card assembly from the at least one fastener without the use of tools.

11. A method for utilizing a PCB bracket system as in claim 10, further comprising the step of:
   utilizing the PCB bracket system in a peripheral component interconnect (PCI) card.

12. A method for utilizing a PCB bracket system as in claim 10, further comprising the step of:
   including at least one electrical connector on the card assembly for providing an electrical interface with the card assembly.

13. A method for utilizing a PCB bracket system as in claim 10, further comprising the step of:
   including an installation connector on the card assembly for providing an interface with the main PCB.

* * * * *